United States Patent [19]

Spence et al.

[11] 4,041,330
[45] Aug. 9, 1977

[54] SELECTABLE EIGHT OR TWELVE DIGIT INTEGRATED CIRCUIT CALCULATOR AND CONDITIONAL GATE OUTPUT SIGNAL MODIFICATION CIRCUIT THEREFOR

[75] Inventors: John R. Spence, Villa Park; Bruce W. Kinney, Jr., Anaheim, both of Calif.

[73] Assignee: Rockwell International Corporation, El Segundo, Calif.

[21] Appl. No.: 633,307

[22] Filed: Nov. 19, 1975

Related U.S. Application Data

[62] Division of Ser. No. 456,997, April 1, 1974, Pat. No. 3,965,459.

[51] Int. Cl.² .......... H03K 17/56; H03K 5/13; H03K 19/08; G11C 11/21
[52] U.S. Cl. .......... 307/251; 307/208; 307/242; 307/268; 307/269; 340/173 R
[58] Field of Search .......... 307/205, 208, 217, 241, 307/242, 251, 269, 270, DIG. 5, 268; 340/173 R

[56] References Cited

U.S. PATENT DOCUMENTS

| | | |
|---|---|---|
| 3,601,634 | 8/1971 | Ebertin .......... 307/251 |
| 3,641,366 | 2/1972 | Fujimoto .......... 307/251 |
| 3,778,784 | 12/1973 | Karp et al. .......... 307/DIG. 5 X |
| 3,786,437 | 1/1974 | Croxon et al. .......... 340/173 R |
| 3,796,893 | 3/1974 | Hoffman et al. .......... 307/251 X |
| 3,806,880 | 4/1974 | Spence .......... 307/205 X |

*Primary Examiner*—John S. Heyman
*Assistant Examiner*—Larry N. Anagnos
*Attorney, Agent, or Firm*—H. Fredrick Hamann; G. Donald Weber, Jr.; Robert Ochis

[57] ABSTRACT

An integrated circuit calculator which can operate in either a twelve digit or an eight digit mode is provided. A conditional modification circuit modifies some of the memory addresses employed in the twelve digit calculator to provide the eight digit calculator with more random access memory registers than the 12 digit calculator. In the twelve digit calculator, the conditional modification circuit also controls folding of some memory registers in order to minimize the chip area required for the memory circuitry and control logic.

10 Claims, 7 Drawing Figures

SELECTABLE EIGHT OR TWELVE DIGIT INTEGRATED CIRCUIT CALCULATOR AND CONDITIONAL GATE OUTPUT SIGNAL MODIFICATION CIRCUIT THEREFOR

This is a division, of application Ser. No. 456,997 filed Apr. 1, 1974, now U.S. Pat. No. 3,965,459.

BACKGROUND OF THE INVENTION

1. Field of the Invention

The invention relates to the field of integrated circuits including gating means, memories and calculators and more particularly to the conditional modification of four phase gates, the modification of memory architecture and the obtaining of calculators with differing capabilities from a common integrated circuit component configuration.

2. Description of Prior Art

Many prior art conditional modification systems are known which modify the output signal from a gate in accordance with whether other output signals from other gates satisfy a predetermined condition. However, such prior art modification systems employ an additional set of gates which, in a clocked gating system, requires an additional clock phase time in which to modify the gate output. The consumption of an additional phase time has the disadvantage that it increases the time required to complete a calculation or function. Also where a circuit has been designed to operate with a specified number of phase times, the subsequent addition of conditional modification cannot be accomplished without increasing the number of phase times required for the operation of the gating circuit. The prior art increased phase time for modification prevents minor modifications from being added to existing gating systems without major redesign. Further, the use of an additional phase time clearly increases the time required to perform any system function or routine.

A number of multipurpose integrated circuit chips are known in the prior art. These chips are provided with the ability to perform one of many functions. The function actually performed is determined by the way in which the individual circuits on the chip are interconnected by the on-chip metallization. These circuits, however, are often wasteful of space as a result of a customization of the circuit which leaves many of the individual circuits unconnected and unused. Also, such chips often result in an inefficient layout of the components actually employed in the final circuit. Further, complicated metallizations are often required to achieve the desired function. Consequently, these circuits severely compromise efficient utilization of chip area in order to obtain great modification flexibility. In addition, maximum circuit efficiency is often sacrificed in modifying such general purpose semiconductor chips to perform a designed function because the devices present on the chip are not those best suited for performance of the function.

Thus, although the prior art systems are useful in some instances, they leave much to be desired in the way of system and material efficiency.

In order to minimize the cost and complexity of solid state calculators, or the like, it is frequently desirable to build the memory and related logic circuitry on a single semiconductor chip. Memories tend to be relatively long compared to their width. Therefore the physical relative dimensions of the memory often hinder maximum efficiency in the layout of logic circuitry. This leads to further inefficiency in the use of material and to an extent of logic circuitry in the production of a modifiable calculator, since the memory dimension may force a contorted layout of the logic circuitry in order to obtain maximum use of the chip.

SUMMARY OF THE INVENTION

The invention achieves a single chip integrated circuit device whose characteristics are controllable by alteration of the diffusion mask. The versatility of the integrated circuit is maximized by the use of folded memories, the shape of which minimizes the semiconductor chip area required by the memory and control circuitry which enables the integrated circuit to function as a calculator when provided with appropriate input and output devices. Folded memories are made possible by the use of a conditional gate modification circuit which modifies clocked gate outputs without requiring an increase in the number of phase times dedicated to the performance of the function. The number and length of random access memory registers is alterable by altering the diffusion mask in the conditional gate modifying means. This allows calculations to be performed with large numbers and with great accuracy, at a cost of reducing the number of random access memory registers available for the storage of data. Alternatively, shorter registers may be employed with a corresponding increase in the number of registers available and a decrease in the size of the numbers which may be utilized and the accuracy of some operations.

DETAILED DESCRIPTION OF A PREFERRED EMBODIMENT

Figure 1:
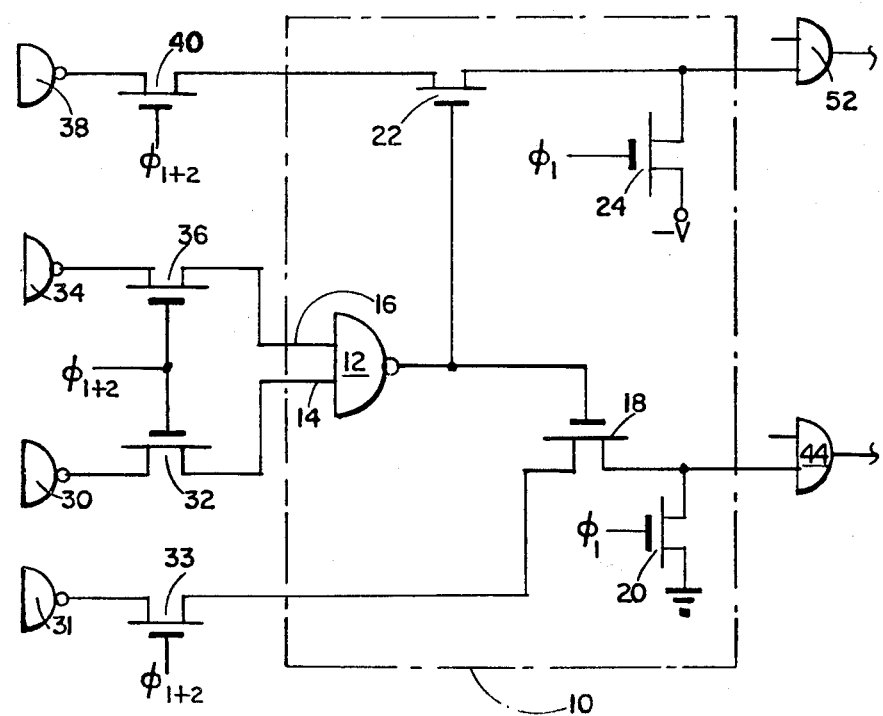
FIG. 1 is a schematic diagram of one embodiment of a conditional modification circuit wich modifies the output of a clocked gate without requiring any increase in the number of phase times employed in controlling the gates.

Although the invention is not limited to four phase gate systems, a four phase conditional modification circuit 10 in accordance with the invention is illustrated in FIG. 1. Gate modification circuit 10 conditionally modifies the output signals from type-two logic gates 31 and 38 in accordance with the output signals from type-two logic gates 30 and 34. Type-two logic gates are those logic gates which are active (or evaluated) during the time period $\phi_2$. That is, the output signal of the gate is evaluated during the $\phi_2$ phase time in accordance with the input signals to the gate during that phase time.

In the illustrated embodiment, the output signal from each of the type-two gates is precharged to an unconditional logical "one" during the $\phi_1$ phase time and evaluated during the $\phi_2$ phase time. The value of the output signal at the end of the $\phi_2$ phase time is determined by values of the input signals to that gate during the $\phi_2$ phase time. A d.c. (or nonclocked) control gate 12, which is illustrated as a NAND gate, has the input terminals 14 and 16 thereof connected to the output terminals of type-two gates 30 and 34 through isolation transistors 32 and 36, respectively. Isolation transistors 32 and 36 which may preferably be field effect transistors, each have the gate electrode thereof connected to the source of the $\phi_{1+2}$ clock signal. Transistors 32 and 36 isolate gates 30 and 34 from the inputs of gate 12 except during the $\phi_{1+2}$ phase time of the clock signal. Since gate 12 is a d.c. gate, the output signal produced thereby is a function of the instantaneous input signals supplied thereto from gates 32 and 34.

Isolation transistor 40 and conditional isolation transistor 22 are connected in series between the output terminal of type-two gate 38 and a first input terminal of a type-three gate 52. The gate electrode of isolation transistor 40 is connected to receive the clock signal $\phi_{1+2}$ which renders transistor 40 conductive only during the $\phi_{1+2}$ clock period. The gate electrode of conditional isolation transistor 22 is connected to the output terminal of d.c. control gate 12. Thus, the isolation of type-three gate 52 from type-two gate 38 during the $\phi_{1+2}$ phase time is controlled by gate 12.

A type-three gate precharges to an unconditional logical one during the $\phi_1$ or the $\phi_{1+2}$ phase time and evaluates (or is active) during the $\phi_3$ phase time. Because the $\phi_3$ phase time follows the $\phi_2$ phase time without any intervening phase time, the conditional modification of the output of type-two gate 38 must be achieved without the necessity of dedicating a phase time for the modification. Precharge transistor 24 is connected between the first input terminal of gate 52 and a reference voltage supply, which in the illustrated embodiment is a negative supply voltage, $-V$. Transistor 24 has the gate thereof connected to a source of a clock signal $\phi_1$ in order that the first input terminal of type-three gate 52 may be charged to a negative voltage during the $\phi_1$ phase time. The negative voltage corresponds to a logical one in the illustrated embodiment.

The output of terminal of a type-two gate 31 is connected to a first input terminal of a type-three gate 44 by the series connection of an isolation transistor 33 and conditional isolation transistor 18. Transistor 33 has the gate electrode thereof connected to the source of the clock signal $\phi_{1+2}$. Transistor 33 is, thus, rendered conductive during the clock period $\phi_{1+2}$. Transistor 18 has the gate electrode thereof connected to the output terminal of control gate 12 so that signal conduction through transistor 18 is effectively controlled by the output signal of gate 12. A precharge transistor 20 is connected between a first input terminal of gate 44 and a source of reference potential which in the illustrated embodiment is ground voltage. Transistor 20 has the gate electrode thereof connected to the source of the clock signal $\phi_1$, in order that the first input terminal of gate 44 may be precharged to ground voltage during the $\phi_1$ phase time. Ground voltage corresponds to a logical "0" in the illustrated embodiment.

In the illustrated embodiment, gate 12 controls the conditional modification of the output of two gates (i.e. one to a logical zero and one to a logical one). It should be understood, however, the gate modification system can be employed to control the conditional modification of one or more gates, with the number limited only by the ability of control gate 12 to drive the conditional isolation transistors.

Among other possible modifications to the circuit of FIG. 1, the output of the same type-two gate may be used both as the signal to be conditionally modified and as an input to the control gate for use in determining whether the output of the gate should be modified. Further, gate multiplexing can be provided either with or without modification of the gates multiplexed with the modified gates.

Figure 2:
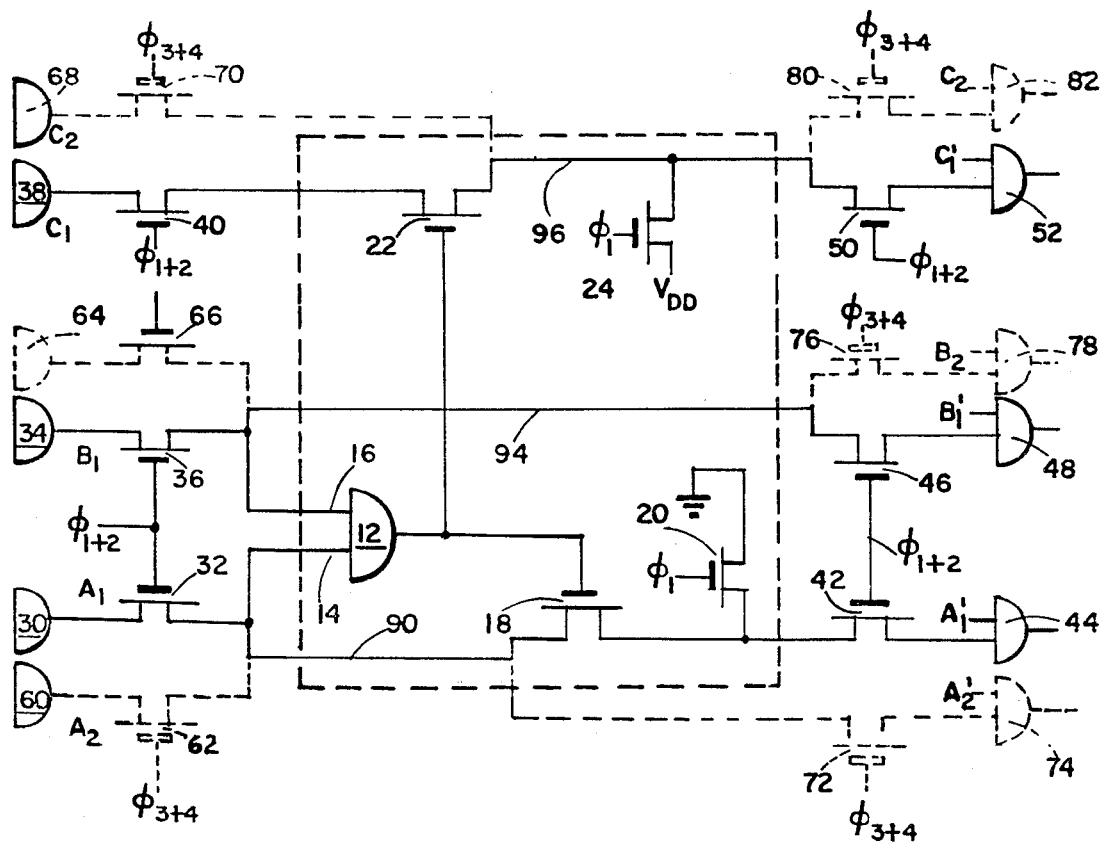
FIG. 2 is another embodiment of the invention shown in FIG. 1.

The circuit illustrated in schematic diagram form in FIG. 2 is an example of a multiplexed circuit connection. The circuit shown in FIG. 2 in solid lines is substantially similar to the circuit of FIG. 1, with the addition of a type-three gate 48 connected through a series isolation field effect transistor 46 to the output of gate 34. Also, type-two gate 31 and associated isolation transistor 33 are eliminated in this embodiment. Moreover, the output of gate 30 is connected through transistor 32 to input 14 of gate 12 and through transistor 18 to the first input of gate 44. Also, in the embodiment of FIG. 2, isolation transistors 42 and 50 are connected in series between common conductors 90 and 96 and the first input terminals of gates 44 and 52, respectively. The circuit portion illustrated in FIG. 2 in dashed form is additional logic circuitry which is multiplexed with the logic circuitry shown in solid lines. For example, gate 60 is multiplexed with gate 30 and is periodically isolated from common conductor 90 by isolation transistor 62. Gate 64 is multiplexed with gate 34 and is periodically isolated from common conductor 94 by isolation transistor 66. Gate 68 is multiplexed with gate 38 and is periodically isolated from common conductor 96 by isolation transistor 70. The gate electrode of each of the isolation transistors 62, 66 and 70 is connected to a source of a $\phi_{3+4}$ clock signal. Gates 60, 64 and 68 are type-four gates, that is they precharge during the $\phi_3$ phase time and evaluate during the $\phi_4$ phase time.

The output signal from gate 60 is applied as an input signal to gate 74 which is multiplexed with gate 44. Gate 74 is periodically isolated from common conductor 90 by an isolation transistor 72. The output signal from gate 64 is applied as an input signal to a gate 78 which is multiplexed with gate 48. Gate 78 is periodically isolated from common conductor 94 by an isolation transistor 76. The output signal from gate 68 is applied as an input signal to a gate 82 which is multiplexed with gate 52. Gate 82 is periodically isolated from common conductor 96 by an isolation transistor 80. Each of the isolation transistors 70, 76 and 80 has a gate electrode thereof connected to a source of a $\phi_{3+4}$ clock signal. The gates 74, 78 and 82 are type-one gates in that they precharge in the $\phi_3$ or the $\phi_{3+4}$ phase times and evaluate in the $\phi_1$ phase time.

As shown, the outputs of the type-four gates 60, 64 and 68 which are multiplexed with the type-two gates 30, 34 and 38, respectively, are not modified by the conditional gate modification circuit 10. If it is desired to modify multiplexed gate 60 in the same manner as gates 30, transistor 18 (or similar transistor) is connected in the common conductor 90. Similarly, if it is desired to modify multiplexed gate 68 in the same manner as gate 30, transistor 22 is connected in common conductor 96. Transistors 20 and 24 must then have both the $\phi_1$ and the $\phi_3$ clock signals applied to their gate electrodes in order to properly perform their precharging functions. Alternatively additional transistors having their gate electrodes connected to the source of the $\phi_3$ clock signal may be provided.

Interference by the data from one of the multiplexed logic systems with data from the other multiplexed logic systems is prevented by connecting only gates of one of the systems to common conductors 90, 94 and 96 at any one time. This connection requirement is met by the connection of the gate electrodes of the isolation transistors: 32, 36, 40, 42, 46 and 50, of the basic circuit to the $\phi_{1+2}$ clock line, combined with the connection of the gate electrodes of the isolation transistors 62, 66, 70, 72, 76 and 80, of the "dashed" or multiplexed circuit to the $\phi_{34}$ clock line.

The output signal from type-two gate 30 is designated $A_1$, the output signal from type-two gate 34 is designated $B_1$ and the output signal from type-two gate 38 is designated $C_1$. The input signal to the first input terminal of type-three gate 44 is designated $A_1'$ to distinguish the fact that the $A_1$ signal is subject to modification prior to being applied to the first input terminal of gate 44. The input signal to the first input terminal of type-three gate 48 is designated $B_1$ since the output signal of gate 34 is not subject to modification before application to gate 48. The input signal to the first input terminal of type-three gate 52 is designated as $C_1'$ because the output signal $C_1$ from gate 38 is subject to modification prior to being applied to the first input terminal of gate 52. The output signals from gates 60, 64 and 68 are designated $A_2$, $B_2$ and $C_2$, respectively because gates 60, 64 and 68 are multiplexed with gates 30, 34 and 38, respectively. The inputs to the gates 74, 78 and 82 are designated $A_2$, $B_2$ and $C_2$, respectively because in the circuit shown the output signals from gates 60, 64 and 68 are not subject to modification before being applied to the input terminals of gate 74, 78 and 82, respectively.

Figures 3, 4, 5:
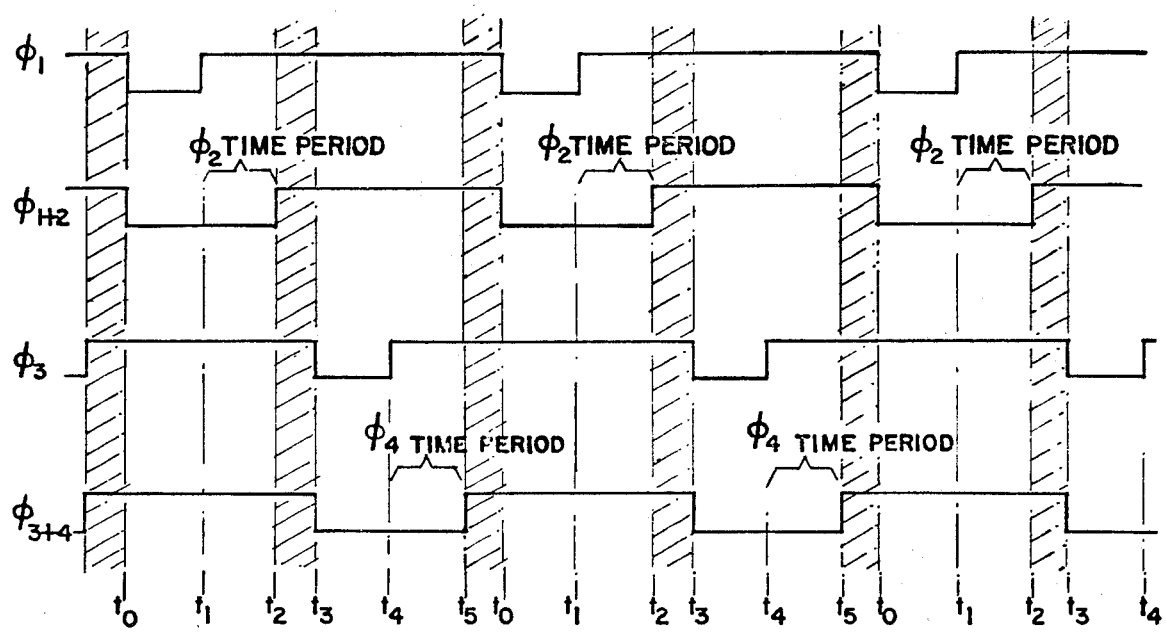
FIG. 3 is a diagram of the clock signals supplied to the circuits shown in FIGS. 1 and 2.
FIG. 4 is a symbolic illustration of the relative dimensions of a full-length memory comprised of 32 digits of random access storage per "row" and three rows for a total of 96 digits of random access memory.
FIG. 5 is a symbolic illustration of modified relative dimensions of the memory of FIG. 4 reduced to 24 digits per row while retaining the same information storage potential (96 digits) by adding a fourth row.

FIG. 4 illustrates a representative layout of a memory comprised of six 16 digit registers of random access memory for a total storage capacity of 96 digits. The easiest way to design such a memory is to make the memory register 16 digits long and 6 registers high. However, such a layout on a semiconductor chip would use an excessive (width or height) of the chip while not using a sufficient length of the chip to make efficient use of the chip. Further, an efficient layout of the logic control circuitry would be very difficult to achieve. On the other hand, if the memory were 2 registers long and 3 registers high, it would use too much length of the semiconductor chip and not enough of its width for an efficient layout. However, if the memory is made 24 digits long by four registers high, an efficient memory layout on chip can be achieved which allows efficient layout of the control circuitry and still provides 96 digits of storage.

A typical one chip calculator may require 96 digits (or 384 bits at 4 bits per digit) of random access memory capability (eight 12 digit registers or six 16 digit registers) while requiring on the order of 10,000 bits of read only memory storage capability for storing the operational programs for controlling operation of the calculator, look up tables for the use in the program and other read only memory functions. Such a read only memory when organized in blocks of 64 words each or 128 words each presents similar problems to those presented by the random access memory. Use of blocks of 96 words each yields an efficient use of the semiconductor chip.

It might appear, that 10,000 bits of ROM would require many times the chip area required for 384 bits of RAM. However, the individual storage cells of a read only memory require much less semiconductor surface area than the storage cell for storing one bit of data in a random access memory because the random access memory cell must be capable of storing both ones and zeroes and being written into in addition to being read from. Consequently, in laying out the circuit chip of one chip calculator, the area required for the random access portion of the memory is a significant fraction of the total area required for memories. Thus, the random access memory problems referred to above cannot be avoided by placing the random access memory in a small corner of the chip. Further in order to minimize unnecessary circuit redundancy, it is preferred to employ a common x-address decoder for both the random access memory and the read only memory as described in co-pending U.S. patent application Ser. No. 204,015 by John R. Spence, entitled "Multiplexing System for Address Decode Logic", filed Dec. 2, 1971 now U.S. Pat. No. 3,806,880. Consequently, the same X address layout for both the random access and the read only memory is desirable.

A RAM with 6 data registers of 16 digits of storage each is illustrated in FIG. 5. Registers 1–4 are laid out conventionally and registers 5 and 6 are folded. Such a modification of the memory of FIG. 4 however raises problems where a common decoder is employed for addressing a read only memory (ROM) and a random access memory (RAM) because the number of digits (16) to be stored in a register of the RAM is a submultiple of 128, but is not a submultiple of 96. Under these circumstances, the RAM is comprised of registers at least some of which cannot accomodate a full data word without folding the register. Such a memory system is illustrated in greater detail in FIG. 6 where the construction of an RAM with 16 digit registers which operates in a digit serial (4 bit digits) bit parallel manner. Because of the digital serial bit parallel operation of the RAM, the same X decoder can be used to address 24 digits of the RAM and 96 words of the ROM. Each RAM digit is addressed by the position of one of its bits and all of the bits are read out. That same X address would address only one ROM word, while the intervening words are addressed by additional addresses. Thus, a five bit address may be used for the RAM (with two latent zero bits providing a total of seven bits) and a seven bit address may be used for the ROM. Thus, the RAM address carries two implied zero bits. To address the ROM words corresponding to the RAM addresses, the ROM address ends in 00. To address the intervening ROM words, the address ends in 01, 10 or 11.

Figure 6:
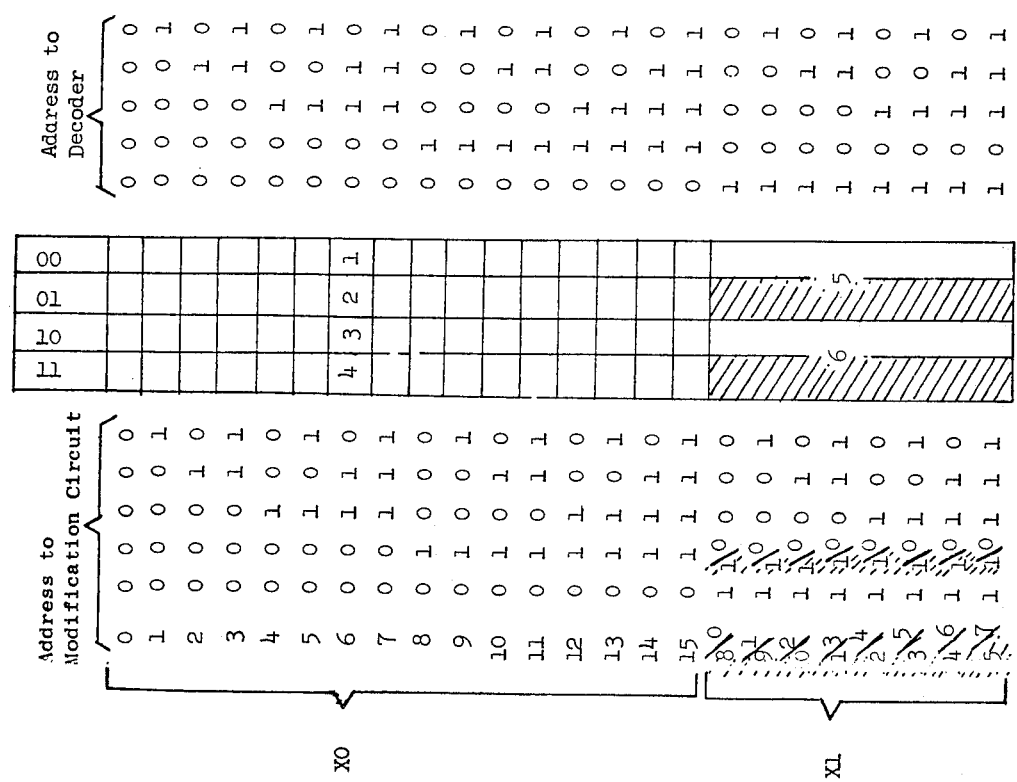
FIG. 6 illustrates a register configuration and addressing code employable with the memory of FIG. 5 to achieve memory registers of 16 digits each.

In the memory of FIG. 6 there are six 16 digit memory registers, four of which are complete within a single "Y" address location and two of which are folded into two "Y" addresses each. Such a folding system creates significant memory addressing problems since a straight forward addressing techniques are not available.

The conditional modification circuit of FIG. 2 overcomes the addressing problems of the memory of FIG. 6 so that a programmer is unaware of the folding of the memory, but instead uses normal addressing labels for each of the registers or desired digits thereof. In this memory, a five bit address code is required for determining the X address of a digit to be accessed and a two bit Y address code is required for determining the Y address of the digit to be accessed.

The actual address which must be provided to the X decoder to address each digit position along the length of the register is illustrated to the right of the memory register in FIG. 6. The first 16 digit positions are directly addressable by the binary code for the numbers zero through 15. The remaining 8 digit positions are addressable by the binary codes for the numbers 16 through 23. However, if the address of a digit is looked on as a four digit code, then the first 16 digit positions are still addressed by the numbers zero through fifteen in what may be looked on as the X-zero register. The remaining digits are addressed by the binary codes for the numbers zero through seven in what may be looked on as an X-one register. The X-zero (X0) and X-one (X1) registers are determined by the value of the fifth X address bit. In the fifth register (the first X one register) the Y positions 00 and 01 together comprise sixteen digits of storage whereby register 5 can be used to store a full register of data. The sixth data register is similarly configured with the Y addresses 10 and 11. Requiring a programmer to address the memory in this fashion would be highly exasperating to the programmer and consequently is unwise from a man/machine interface point of view. The conditional gate modification means of FIG. 2 enables this memory to be addressed in a straight forward manner as having four X0 registers and two X1 registers. In FIG. 6, the address supplied to the conditional gate modification means to address each digit as illustrated to the left of the memory register. Those digit positions which require address modifications in order for proper addressing are shown shaded in the figure. Similarly, those address bits of the corresponding binary code which must be modified are also shaded as are the numbers of the register digit positions to which they correspond. No modification of the addressing for the X0 register is required and consequently its addressing will not be discussed in detail here, since the addressing of such registers is well-known.

With respect to the X1 registers, that is to say, registers 5 and 6 as depicted in FIG. 6, modification is required and is discussed forthwith. For the first eight digits of storage of either register 5 or register 6, no address modification is required. That is, the address codes for the X1 register digits 0-7 are the correct address codes. However, both the X address and the Y address must be modified for the second eight digit positions in each of the registers 5 and 6. That is, the X1 register digits 8-15 will be addressed by a programmer as X1 register digits 8-15 which have the following binary codes 11000, 11001, 11010, 11011, 11100, 11110, 11111, none of which will be decoded as being within the memory. However, by forcing the fourth bit to a zero, the address codes 0-7 will be provided, thus causing a proper X decoding of the address. However, this would just address bits 0-7 unless the "Y" address is also altered. The proper addressing can be achieved by changing the first bit of the "Y" address from a zero to a one. Unfortunately, such modification of the X and Y addresses requires a set of gates to achieve the modification which in the prior art would require an additional phase time thereby generating major memory access problems. However, these changes can be achieved by a gate modification circuit in accordance with FIG. 2 by providing the fourth bit of the X address as the $A_1$ signal and the fifth bit of the X address as the $B_1$ signal and the first bit of the Y address as the $C_1$ signal. Under these conditions, the $A_1$ and $B_1$ signals are both true during the evaluation period only if the second half of register 5 or 6 is being addressed (i.e. an X1 register digits 8-15). Consequently no modification occurs when any of the X0 digits or any of the first eight digits of an X1 register are addressed because the output of gate 12 will be a logical one unless both $A_1$ and $B_1$ evaluate true. Thus the addressing of X0 registers and X1 register digits 0-7 will be proper. When both $A_1$ and $B_1$ evaluate true, the output $B_1$ (the fifth digit of the X address) is applied to gate 48 without modification thus retaining the X address in the one register area. However, the $A_1$ address is applied to gate 44 as $A_1'$ and is forced to a logical zero when both $A_1$ and $B_1$ evaluate true. Thus the address applied to the X decoder is once again in the range 0-7 of the X1 register.

When both $A_1$ and $B_1$ evaluate true, such that the output of control gate 12 is a logical zero, the first Y bit as embodied in $C_1$ is applied to the input of gate 52 as $C_1'$ which is forced to a logical 1 in accordance with the gate modification means operation as described previously. Under these conditions, the second or numerically higher half of the number 5 or number 6 register is addressed in accordance with the second bit of the Y address (0 and 1 respectively). Consequently, to a programmer programming this memory, the memory appears to have four X0 registers and two X1 registers.

The X decoder for decoding the addresses received from the conditional gate modification means is not shown in detail, since such decoders are well known in the art. The decoding function required of the X decoder is straightforward as can be seen from reference to the actual address codes employed for accessing each of the digits in a memory of FIG. 6. It will be noted, that no modifications of the codes actually supplied to the X decoder occurs.

The provision of a memory having registers capable of storing 16 digits enables calculations to be performed on 12 digit number while allowing 4 digits for the storage of various flag and informational data such as the sign of the stored number etc.

Figure 7:
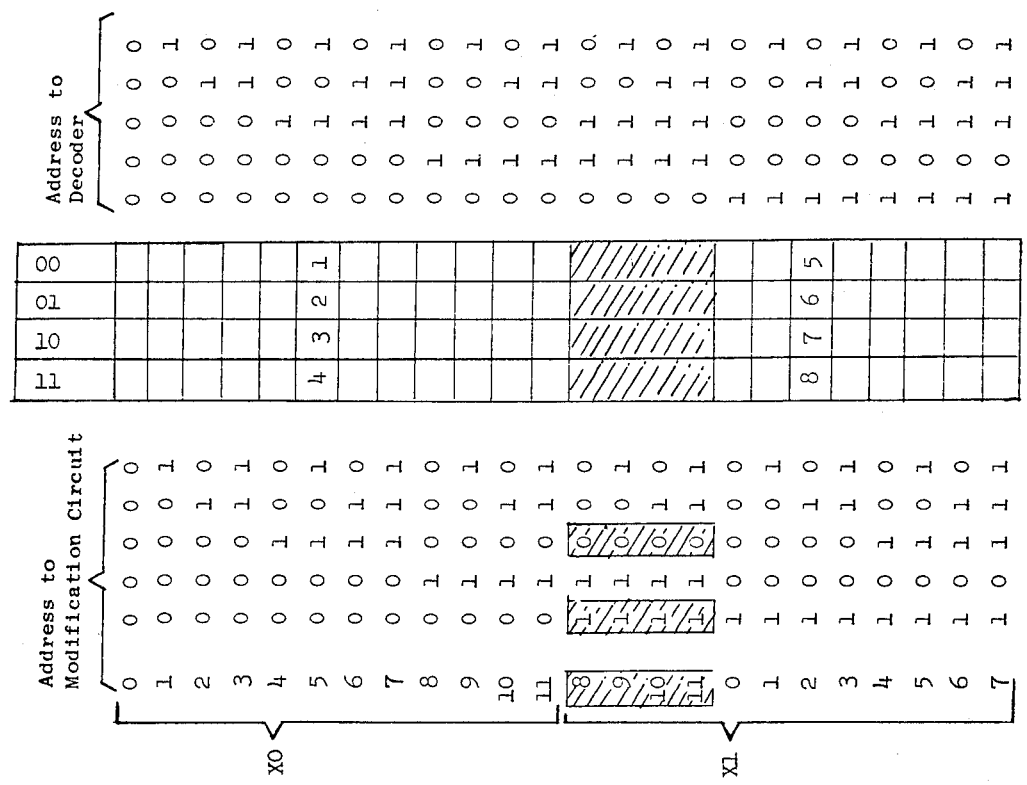
FIG. 7 illustrates the register location and addressing codes for achieving a random access memory of the configuration of FIG. 5 wherein each register has a length of 12 digits.

If 12 digit accuracy is not required of a calculator employing this memory system, greater versatility can be achieved by decreasing the number of digits per register and increasing the numbers of randon access registers. A memory configuration incorporating this feature is illustrated in FIG. 7. In this memory, there are eight 12 digit registers. The 12 digit registers allow calculations to be performed with eight digit numbers with retention of the same informational data in the last four digits of a register as was the case in the use of 16 digit registers for 12 digit calculations. By reducing the number of digits per register, the number of registers has been increased from six to eight thereby increasing the flexibility of the calculator since more information can be stored simultaneously.

The actual binary codes used for addressing the digits of the memory are unchanged by the altered configuration of the memory and consequently no changes need be made in the X-address decoding system. In FIG. 7, the actual address codes used to address each digit are shown to the right of the register and the address codes supplied to the conditional gate modification circuit are illustrated to the left of the corresponding digits. In a fashion similar to that used in connection with the memory of FIG. 6, the registers are divided into X0 and X1 registers, there being four X0 registers and four X1 registers. The digits of the register which require modification of the basic address to provide the address required by the decoder are shaded a they were in FIG. 6, Similarly, the digits of the code which must be modified are also shaded.

The memory in its eight 12-digit register configuration employs no folded registers and consequently requires no modification of Y addressing in modifying the address codes. Reference to FIG. 7 will show that the address provided to the gate modification means must be modified whenever both the fourth and fifth bits of the X address are ones and that the modification necessary is that the fifth bit be changed to a zero and the third bit be forced to a one. This modification can be achieved by the gate modification circuit of FIG. 2 by supplying the fifth digit of the X address as the $A_1$ signal, the fourth digit of the X address as the $B_1$ signal and the third bit of the X address as the $C_1$ signal. With this selection of signals gate modification will occur only as described above with the desired results that when both the fourth and fifth bits are logical ones, the fifth bit will be converted to a logical zero through the operation of transistors 18 and 20 and the third bit of the X addres will be converted to a logical one through the operation of transistors 22 and 24. It may be observed that for convenience in modifying addreses, the digits 8–11 of the X1 register occur in the positions which were occupied by the digits 12–15 of the X0 register in the 16 digit register configuration. This simplifies addressing by eliminating any need to modify the addresses of the last eight digits in each row of the memory. Since the programmer has no knowledge of the altered configuration of the memory, the relative position within the physical register of the digits 8–11 is of no concern, other than for simplicity of addressing purposes.

The modification of the memory of FIG. 6 to the configuration of FIG. 7 does not require any modification of the arithmetic unit of a calculator employing the memory because all calculations are performed on a digit by digit basis which makes the actual length of a memory register irrelevant to the arithmeic unit. However, the use of 12 digit rather than 16 digit registers requires changes in the read only memory which comprises the source of operating instructions for the calculator logic. The required changes in the data in the ROM are achieved by changes in the diffusion mask. The changes in the gate modification means which are required in order to modify the memory of FIG. 6 to the configuration of FIG. 7 are also provided by the diffusion mask. It will be understood that by the provision of an appropriate logic control system, the lengths of the random access memory registers can be made selectable by the control system for the random access memory without, rather than being permanently fixed by the diffusion mask.

The efficient use of semiconductor chip area is maintained whichever memory configuration is employed because all of the storage locations of the random access memory are employed in each configuration of the calculator without rendering any of the logic circuitry of the calculator superfluous.

While the address modifications necesary for addressing the memory configurations of FIGS. 6 and 7 have been described in terms of being performed by the conditional gate modification means of FIG. 2, it will be understood that other gate modification means may be employed for this purpose. If there are available phase times for the modification of the addressing in the timing sequence operation, then it is not necessary to use a conditional gate modification means which does not require a dedicated phase time.

Although the technique of shortening the length of a memory and increasing its width to retain a constant number of storage locations is of general utility, its greatest benefits accrue where the original length of the memory was a power of 2 such as $2^n$ and the original width of the memory was $[2^k + 2^{(k+1)}]/2$ which equals $3 + 2^{(k-1)}$ and the new length and width are $2^{(n-1)} + 2^{(n-2)}$ and $2^{(k+1)}$, respectively. The new length $2^{(n-1)} + 2^{(n-1)}$ is equal to $3 \times 2^{(n-2)}$. Under these conditions, a memory comprised of registers of the length $2^{n-1}$ (of which there were two along the length of the original memory) now fit into the new memory with a set of full length single row registers in one segment of the memory and a set of full length, folded double row registers in the other segment of the memory. The fact that the folded registers are folded in half makes conditional address modification relatively straightforward since it is only necessary to recognize the condition of two bits of the address and to change two bits of the address.

Similarly, for l equal to or greater than four, the new memory can be configured as having two registers in each row, with each register equal to half the length of the memory and the necessary address modifications can be performed by recognizing the conditions of two bits of the address code for those registers as was the case with the specific example discussed above of having two 12 digit registers in a single row in the modified memory having a total length of 24 digits.

OPERATION OF THE PREFERRED EMBODIMENT

The conditional gate modification circuit of FIG. 1 operates in the following fashion.

At the beginning of a clock cycle at time $t_o$ the $\phi_1$ and the $\phi_{12}$ clock signals both become true simultaneously. In the illustrated embodiment a signal is true or a logical one when it is at a negative voltage and a signal is false or a logical zero when it is at ground voltage. Consequently, the voltage supplied by the $\phi_1$ and the $\phi_{12}$ clock signal sources become negative a time $t_o$. The application of negative voltage to the gate electrodes of transistors 20, 24, 32, 33, 36 and 40 renders them conductive. Simultaneously, the output of each of the type two clocked gates (30, 31, 34 and 38) is driven to an unconditional one (a negative voltage). Thus, NAND d.c. control gate 12 receives two true inputs and provides zero output. The zero output from gate 12 renders transistors 18 and 22 non-conductive. Consequently, the output signals from gate 31 and 38 are isolated from the first input terminal of gates 44 and 52, respectively. However, since transistors 20 and 24 are conductive, the first input terminal of gate 44 is driven to ground voltge (a logical zero) and the first input terminal of gate 52 is driven to a negative voltage (a logical one). At the end of the $\phi_1$ phase time at time $t_1$, each of the type-two logic gates (30, 31, 34 and 38) evaluate and the output signal therefrom changes from the logical one impressed thereon during the $\phi_1$ phase time, to a logical zero if the input signals to that gate are such that the gate logic equation requires a zero output, and remains a logical one otherwise. If either gate 30 or gate 34 evaluates to a zero, then at least one of the input signals to d.c. control gate 12 will change to a logical zero. As soon as one of the input signals thereto becomes a logical zero, NAND gage 12 forces its output signal to a logical one. A logical one (negative) output signal from gate 12 renders transistors 18 and 22 conductive. Under such conditions (transistors 18 and 22 conductive) a conductive path is established between the output terminal of type two gate 31 and the first input terminal of type three gate 44 and between the output terminal of type two gate 38 and the first input terminal of type three gate 52. These conductive paths are established because transistors 32 and 40 are both conductive throughout the entire $\phi_{12}$ phase time. With the conductive paths established, the output signals from gates 31 and 38 control the voltage applied to the first input terminal of gates 44 and 52, respectively.

If the output signal from gates 30 and 34 both remain true, then the output signal from gate 12 remains a logicl zero (ground voltage) and no conductive path is established between the outputs of gates 31 and 38 and the first input terminal of gates 44 and 52, respectively. Consequently, the voltages on the first input terminal of gates 44 and 52 remain as they were established during the $\phi_1$ phase time by transistors 20 and 24, respectively.

Since transistor 20 is not conductive during phase time $\phi_2$, a logical one at the output terminal of gate 31 will destroy the logical zero which was impressed on the input terminal of gate 44 by transistor 20 during the $\phi_1$ phase time, whenever transistor 18 is conductive during the $\phi_2$ phase time. As is standard in four phase gate systems, the precharging of gate 31 during the $\phi_1$ phase time charges the output capacitance of the gate to a negative voltge corresponding to a logical one. When gate 31 evaluates during the $\phi_2$ phase time, the output capacitance remains changed if the gate evaluates true and discharges to ground if the gate evaluates false. Since there is no current source available to drive the gate output, except the precharged capacitance, the value of the capacitance must be large enough that the capacitor can supply sufficient charge to the first input terminal of gate 44 to overcome the precharge of that terminal to ground by transistor 20 if transistor 18 is conductive. In so doing, the voltage at the input of gate 44 must become sufficiently negative that it will be interpreted as a logicl one by gate 44. This is a typical charge splitting situation between two capacitors. Normally, three to one ratio of capacitance is sufficient to make the initial voltage across the larger capacitor controlling of the logical interpretation of voltage across the capacitors after the charge split. As explained previously transistor 18 will be conductive if either gate 30 or gate 34 evaluates to a logical zero. However, if neither gate 30 nor 34 evaluates to a logical zero, transistor 18 will remain non-conductive and the logical zero impressed on the first input terminal of gate 44 by transistor 20 will remain. Consequently, the output signal of gate 31 is conditionally modified in accordance with the logical output values from gates 30 and 34. It is to be noted, that in those situations where transistor 18 is non-conductive there is no actual modification of the output signal of gate 31 whenever the output signal from gate 31 is a logical zero since this value is impressed on the input terminal of gate 44.

The modification of the output signal from gate 38 is substantially similar to the modification of the output signal from gate 31. That is, if both gate 30 and 34 evaluate true, then the output signal from gate 12 is a logical zero and transistor 22 is non-conductive during the $\phi_2$ phase time. Under these conditions, the logicl one which transistor 24 impressed on the first input terminal of gate 52 during the $\phi_1$ phase time remains. In contrast, if either gate 30 or 34 evaluates false, the output signal from control gate 12 is a logical one and transistor 22 is rendered conductive. Under these conditions the same type of charge split will occur as described in connection with gates 31 and 44, except that a logical zero output from gate 38 will bleed enough charge from the first input terminal of gate 52 that the voltage thereat will rise at a level which gate 52 will interpret as a logical zero. Consequently, where transistor 18 is conductive during the $\phi_2$ phase time, the output signal from gate 38 will control the logicl value of the signal applied to the first input terminal of gate 52. Consequently, the output of first type gate 38 is conditionally modified in accordance with the output signals from first type gates 30 and 34. Here again, even when gates 39 and 34 evaluate true, such that transistor 22 is non-conductive, there is no actual modification of the output value of gate 38 whenever gate 38 evaluates true because a true signal is impressed on the first input terminal of gate 52. Thus whenever both gates 30 and 34 evaluate true, the input signals to the first input terminal of gates 44 and 52 are forced to a logical zero and a logical one, respectively.

Gate 12 is designed to be a fast operating gate, such that gate 12 will evaluate in accordance with the evaluation of gates 30 and 34 during the $\phi_2$ clock period and consequently will render transistors 18 and 22 conductive during the latter portion of the $\phi_2$ phase time whenever either gate 30 or 34 evaluates false (i.e. as a logical zero). Under these conditions, the input signal to the first input terminals of gates 44 and 52 will be determined prior to the end of the $\phi_2$ phase time at $t_2$. Consequently, at the beginning of the $\phi_3$ clock phase time at time $t_3$ the input signals to the first input terminals of gates 44 and 52 will already be determined, as would be the case in the absence of conditional gate modification circuit. Since the type three gates 44 and 52 do not evaluate until the $\phi_3$ phase time, these gates will evaluate in accordance with the conditionally modified outputs from gates 31 and 38, respectively.

A conditional gate modification circuit has been shown in FIG. 1 and described. This circuit achieves conditional gate modification in clocked gate systems without the necessity of dedicating a phase time for the modifications to occur.

The operation of the logic circuit of FIG. 2 will be traced through slightly more than one complete clock cycle in order to clearly demonstrate the sequential operation of the circuit. At the beginning of a clock cycle at time $t_o$ the $\phi_1$ and $\phi_{12}$ clock signals become true. When the $\phi_{12}$ clock signal becomes true, transistors 32, 36, 40, 42, 46, and 50 become conductive. During the $\phi_1$ clock phase time, the output signals $A_1$, $B_1$, $C_1$ from gates 30, 34, and 38 respectively are driven to negative voltages corresponding to logical ones. The conduction of transistors 32 and 36 applies the output signals $A_1$ and $B_1$ from gates 30 and 34, respectively to the first and second input terminals 14 and 16, respectively of d.c. control gate 12. The transmission of the signals $A_1$, $B_1$ to the input terminals of NAND d.c. control gate 12 forces the output thereof to a logical zero. The logical zero at the output terminal of control gate 12 renders transistors 18 and 22 non-conductive as was the case in the operation of circuit of FIG. 1.

Conduction in transistor 32 provides a conductive path from the output of type two gate 30 to the source of transistor 18, which transistor is rendered non-conductive during the $\phi_1$ phase time by the logical zero output signal from gate 12. Conduction in transistor 42 provides a conductive path from the drain of transistor 18 to the first input terminal of type three gate 44. Thus, only the non-conductance of transistor 18 interrupts an otherwise continuous conductive path from the output terminal of gate 30 to the first input terminal of gate 44.

Conduction of transistor 36 in combination with the conduction in transistor 46 provides a continuous conductive path from the output terminal of gate 34 to the first input terminal of gate 48.

Conduction of transistor 40 provides a conductive path from the output terminal of gate 38 to the source of transistor 22 which transistor is rendered non-conductive during the $\phi_1$ phase time by the logical zero output signal from gate 12. Conduction in transistor 50 provides a conductive path from the drain of transistor 22 to the first input terminal of gate 52. Only the non-conductance of transistor 22 interrupts the otherwise continuous conductive path from the output terminal of gate 38 to the first input terminal of gate 52.

In addition, when the $\phi_1$ clock signal becomes true, transistors 20 and 24 are rendered conductive. Conduction in transistor 20 impresses ground voltage on the first input terminal of gate 44. This corresponds to a logical zero. Conduction in transistor 24 inpresses the negative supply voltage minus one transistor threshold voltage ($V_T$) or $-(V-V_T)$ on the first input terminal of gate 52. This corresponds to a logical one.

Subsequently, at time $t_1$ the $\phi_1$ clock signal goes false or returns to a zero value, thus beginning the $\phi_2$ phase time. When the $\phi_1$ clock signal goes false, transistors 20 and 24 are rendered non-conductive. This leaves the first input terminal of gate 44 precharged to a logical zero and the first input terminal of gate 52 precharged to a logical one. During the $\phi_2$ clock pulse time, type two gates 30, 34, and 38 evaluate. The results of the evaluation of these gates are similar to the results of the evaluation of corresponding gates in the circuit of FIG. 1. Type three gates 44, 48, and 52 precharge during either the $\phi_1$ or the $\phi_{12}$ phase times, consequently they are precharged prior to time $t_2$ when the $\phi_2$ phase time ends. At time $t_2$ the $\phi_{12}$ clock returns to ground voltage. The return of the $\phi_{12}$ clock signal to ground voltage renders transistors 32, 36, 40, 42, 46, and 50 non-conductive. Prior to the time when these transistors become non-conductive, the output signals from gates 30, 34, and 38 have been applied to the input terminals of gates 44, 48, and 52. As is appropriate in view of the output signal from control gate 12. As discussed in connection with FIG. 1, the values of the $A_1'$ and $C_1'$ signals may be modified from the values of the $A_1$ and $C_1$ signals in accordance with the privisions of the conditional gate modifications network. The non-conductivity of transistors 42, 46 and 50 isolates the first input terminal of each gate 44, 48 and 52 from common conductors 90, 94 and 94, respectively, once the $\phi_{12}$ clock signal has returned to ground voltage at time $t_2$. Consequently, these common conductors can be employed to conduct other information after time $t_2$ without any adverse effect on the information conducted during the $\phi_2$ phase time.

Subsequent to the return of the $\phi_1$ and $\phi_{12}$ clock signals to their zero conditions at time $t_2$, there is a short stabilization period during which all clock signals are zero. This period is shaded in FIG. 3. At the end of this short stabilization period at time $t_3$, and $\phi_3$ clock signal and the $\phi_{34}$ signal become true. During the $\phi_3$ phase time which begins at time $t_3$ type three gates 44, 48 and 52 evaluate and their output signals are processed further in accordance with the requirements of the logic system of which they form a part. As a result of the $\phi_{34}$ clock signal becoming true, transistors 62, 66, 70, 72, 76, and 80 are rendered conductive. In the circuit illustrated in FIG. 2, this creates separate continuous conductive paths (1) from the output terminal of type four gate 60 to the first input terminal of type one gate 74 along common conductor 90; (2) from the output terminal of type four gate 64 to the first input terminal of type one gate 78 along common conductor 94; and (3) from the output terminal of type four gate 68 to the first input terminal of type one gate 82 along common conductor 96. During the period when the $\phi_3$ clock signal is true, the output signals $A_2$, $B_2$ and $C_2$ from type four gates 60, 64, and 68, respectively are precharged to logical ones. These values are applied at the first input terminals of gates 74, 78, and 82, respectively. The output signals $A_2$ and $B_2$ are also applied to the input terminals 14 and 16 of gate 12, but their effect will not be discussed here since gate 12 does not control any transistors in the conductive paths which are established during phase times $\phi_3$ and $\phi_4$. When the $\phi_3$ clock signal goes false at time $t_4$ and $\phi_4$ phase time begins and type four gates 60, 64 and 68 evaluate and control the voltages applied to the first input terminal of the type one gate 74, 78 and 82, respectively. After the $\phi_{24}$ clock signal returns to its false or zero condition at time $t_5$, thus ending the $\phi_4$ phase time and the clock cycle, a short dead time is provided before the beginning of the next clock cycle during which dead time all the clock signals are zero. At time $t_5$ transistors 62, 66, 70, 72, 76 and 80 are rendered non-conductive by the application of ground voltage to the gate electrodes thereof by the $\phi_{34}$ clock. This isolates the voltages at the first input terminals of gates 74, 78 and 82 from common conductors 90, 94 and 96, respectively, thereby preserving these values until after gates 74, 78 and 82 evaluate.

During the $\phi_1$ phase time of the next clock cycle which begins at time $t_o$ of the next clock cycle, the outputs of type-one gates 74, 78 and 82 evaluate and are further processed in accordance with the logic system of which they form part.

In this way, during the $\phi_1$ phase time of each clock cycle, all type one gates (74, 78 and 82) evaluate, all type two gates (30, 34, and 38) precharge and the first input terminals of type three gates 44 and 52 are precharged by transistors 20 and 24, respectively. During the $\phi_2$ phase time all type two gates (30, 34 and 38) evaluate and the new output values are transferred to the first input terminals of type three gates 44, 48 and 52, respectively with any modifications resulting from the operation of control gate 12. All type three gates (44, 48 and 52) precharge during either the $\phi_1$ or the $\phi_{12}$ phase time. All of these events occur without interference with each other because of the isolation provided by non-conductive transistors 62, 66, 70, 72, 76 and 80.

During the $\phi_3$ phase time of each clock cycle, all type three gates (44, 48 and 52) evaluate and all type four gates (60, 64, an 68) precharge. During the $\phi_4$ phase time all type four gates (60, 64, and 68) evaluate and their new output values are transferred to the first input terminals of type one gates 74, 78 and 82, respectively. All type one gates 74, 78 and 82) precharge either during the $\phi_3$ or the $\phi_{34}$ phase time. All of these events occur without interference with each other because of the isolation provided by non-conductive transistors 32, 36, 40, 42, 46, and 50. In this way, maximum use is obtained from the logic circuitry of FIG. 2 without conflicts arising between the two different sets of data which are multiplexed.

As pointed out above if it is desired to do so, it is a simple matter to modify the outputs of the second or multiplexed set of gates in the same fashion as the first set of gates is multiplexed by moving transistors 18 and 22 into the common lines 90 and 96. In this case, additional transistors corresponding to transistors 20 and 24 would have to be provided with their gate signals connected to the source of $\phi_3$ clock signals or else the gates of transistors 20 and 24 would have to have the ORed combination of the $\phi_1$ and $\phi_3$ clocks applied thereto. Where the additional transistors are provided, the value to which the $A_2'$ and $C_240$ signals are modified can be altered from the values to which the $A_1'$ and $C_1'$ signals are modified by changing the reference potential to which the additional transistors are connected. If it is desired to modify different ones of the multiplexed gates or in response to a different set of gate outputs, then additional transistors corresponding to transistors 18 and 22 may be inserted in the appropriate multiplexed branches and controlled by either the same control gate 12 or a separate control gate similar to gate 12 which is responsive to the outputs of a different set of gates. In this way, a maximum amount of data and information can be handled by the gating circuit of FIG. 2 thus achieving a minimization of circuit area required for the implementation of the logic system.

The operations of the memories of FIG. 6 and FIG. 7 are of a standard nature since they function in response to the address supplied to the input of the conditional gate modification means as normal memories employing straightforward decoding. Similarly, they function as standard memories in response to the addresses actually supplied to the address decoder by the conditional gate modification means. Consequently, the detailed operation of the memories is omitted from this description in order to avoid obscuring the description of the ivention herein.

A conditional gate modification means and reconfigurable calculator employing variable length memory registers has been illustrated and described. The preferred embodiment is illustrative and not intended to be limitative. Those skilled in the art may be able to modify the embodiments shown and described. Such modifications which do not depart from the scope of the invention are intended to be covered by the appended claims.

We claim:

1. Conditional modification means for conditionally modifying the output of a clocked gate means in response to the logical value of the output signal from at least one first-type gate, said modification being made without consuming a phase time in performing the modification, said conditional modification means comprising:
    control gate means having an input terminal and an output terminal, said control gate means being responsive to said at least one first-type gate, said control gate means providing a first isolation control signal at the output terminal thereof;
    conditional isolation means having an input terminal, an output terminal and a control terminal, the input terminal of said conditional isolation means connected to an output terminal of said clocked isolation means the control terminal of said conditional isolation means connected to the output terminal of said control gate means, said conditional isolation means rendering said input terminal of said conditional isolation means and said output terminal of said conditional isolation means electrically connected when a first type signal is applied to said control terminal of said conditional isolation means and rendering said input terminal of said conditional isolation means and said output terminal of said conditional isolation means electrically isolated when a second type signal is applied to said control terminal of said conditional isolation means; and
    output precharging means having an input terminal and an output terminal, said output terminal of said precharging means being connected to the output terminal of said conditional isolation means for precharging the output terminal of said conditional isolation means to a predetermined state, said predetermined state being the one to which the output of said clocked gate means is to be modified when the control gate means renders the conditional isolation means isolating.

2. The conditional modification means recited in claim 1 wherein said conditional modification means comprises a plurality of conditional isolation means having the control terminals thereof connected to the output terminal of said control gate means for conditionally modifying the output signals from a plurality of clocked gate means.

3. The conditional modification means recited in claim 2 wherein:
    said clocked gate means comprises a first-type gate; and
    the output terminal of a selected first-type gate is electrically connected to an input terminal of said control gate means and to the input terminal of a conditional isolation means, whereby the output signal from said selected first-type gate is one of the signals which controls the state of said control gate means to control whether the outputs of conditionally modified clocked gate means are modified by said conditional modification means and is itself conditionally modified by said conditional modification means.

4. The conditional modification means recited in claim 1 wherein said conditional isolation means comprises a field effect transistor having gate, source and drain electrodes, and wherein the source electrode of said field effect transistor comprises the input terminal of said conditional isolation means, the drain electrode of said field effect transistor comprises the output terminal of said conditional isolation means and the gate electrode of said field effect transistor comprises the control terminal of said conditional isolation means.

5. The conditional modification means recited in claim 1 wherein said precharging means comprises a field effect transistor having gate, source and drain electrodes, and wherein said drain electrode comprises the output terminal of said precharging means, the source terminal comprises the input terminal of said precharging means and the gate electrode comprises a control terminal of said precharging means.

6. The conditional modification means recited in claim 1 further comprising second isolation means connected in series with the output terminal of said first-type gate means to control the transmission of the output signal of said first-type gate means to other devices in accordance with the state of said second isolation means.

7. The conditional modification means recited in claim 1 further comprising:

a second-type gate means having at least a first input terminal, said first input terminal being connected to the output terminal of said conditional isolation means and to the output terminal of said precharging means whereby the conditional modification means modifies the input to said second-type gate means without consuming a phase time for performing the modification.

8. The conditional modification means recited in claim 7 further comprising:

second isolation means connected in series with the output terminal of a selected first-type gate means to control the transmission of the output signal of said selected first-type gate means to other devices in accordance with the state of said second isolation means;

third isolation means connected in series with the first input terminal of said second-type gate means to control the transmission of input signals to said first input terminal of said second-type gate means in accordance with the state of said third isolation means;

said second and said third isolation means being responsive to a second isolation control signal;

third-type gate means having a fourth isolation means connected in series with the output terminal thereof to control the transmission of the output signal of said third-type gate means to other devices in accordance with the state of said fourth isolation means, said series combination of said third-type gate means and said fourth isolation means being connected in parallel with the series combination of said selected first-type gate means and the second isolation means;

fourth-type gate means having a fifth isolation means connected in series with a first input terminal thereof to control the transmission of input signals to said first input terminal of said fourth-type gate means in accordance with the state of said fifth isolation means, said series combination of said fourth-type gate means and said fifth isolation means being connected in parallel with the series combination of said second-type gate means and said third isolation means;

said fourth and fifth isolation means being responsive to a third isolation control signal, said second and third isolation control signals rendering isolation means responsive thereto conductive when said control signals are in a first state and non-conductive otherwise, said second and third isolation control signals not both being in said first state at the same time whereby said fourth and fifth isolation means are non-conductive when said second and third isolation means are conductive whereby a plurality of different data signals may be transmitted through said conditional modification means during each clock cycle without the different data signals interfering with each other.

9. The conditional modification means recited in claim 8 wherein said second, third, fourth and fifth isolation means are clocked isolation means and said second isolation control signal is a first clock signal and said third isolation control signal is a second clock signal and said first and second clock signals, when true, render the isolation means responsive thereto non-isolating and said first and second clock signals are not both true at the same time.

10. The conditional modification means recited in claim 1 wherein said clocked gate means comprises a first-type gate.

* * * * *